US009336896B1

(12) United States Patent
Hsu

(10) Patent No.: US 9,336,896 B1
(45) Date of Patent: May 10, 2016

(54) SYSTEM AND METHOD FOR VOLTAGE REGULATION OF ONE-TIME-PROGRAMMABLE (OTP) MEMORY PROGRAMMING VOLTAGE

(71) Applicant: Integrated Device Technology, Inc., San Jose, CA (US)

(72) Inventor: John Hsu, Sunnyvale, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/666,226

(22) Filed: Mar. 23, 2015

(51) Int. Cl.
G11C 17/00 (2006.01)
G11C 17/18 (2006.01)
G11C 17/16 (2006.01)

(52) U.S. Cl.
CPC ............... *G11C 17/18* (2013.01); *G11C 17/16* (2013.01)

(58) Field of Classification Search
CPC ........................................................ G11C 17/00
USPC .................................................. 365/96, 225.7
See application file for complete search history.

(56) References Cited

U.S. PATENT DOCUMENTS

| 4,862,485 | A | 8/1989 | Guinea et al. |
|---|---|---|---|
| 5,663,105 | A | 9/1997 | Yu et al. |
| 5,757,240 | A | 5/1998 | Boerstler et al. |
| 5,903,195 | A | 5/1999 | Lukes et al. |
| 6,259,327 | B1 | 7/2001 | Balistreri et al. |
| 6,640,311 | B1 | 10/2003 | Knowles et al. |
| 6,650,193 | B2 | 11/2003 | Endo et al. |
| 6,683,506 | B2 | 1/2004 | Ye et al. |
| 6,727,767 | B2 | 4/2004 | Takada et al. |
| 6,768,387 | B1 | 7/2004 | Masuda et al. |
| 7,012,476 | B2 | 3/2006 | Ogiso et al. |
| 7,323,916 | B1 | 1/2008 | Sidiropoulos et al. |
| 7,405,594 | B1 | 7/2008 | Xu et al. |
| 7,434,083 | B1 | 10/2008 | Wilson et al. |
| 7,541,848 | B1 | 6/2009 | Masuda et al. |
| 7,545,188 | B1 | 6/2009 | Xu et al. |
| 7,573,303 | B1 | 8/2009 | Chi et al. |
| 7,586,347 | B1 | 9/2009 | Ren et al. |
| 7,671,635 | B2 | 3/2010 | Fan et al. |
| 7,737,739 | B1 | 6/2010 | Bi et al. |

(Continued)

OTHER PUBLICATIONS

"19-Output PCIE Gen 3 Buffer", Si53019-A01A, Silicon Laboratories Inc., Rev. 1.1 May 2015, 34 Pages.

(Continued)

*Primary Examiner* — Harry W Byrne
(74) *Attorney, Agent, or Firm* — Glass & Associates; Molly Sauter; Kenneth Glass

(57) ABSTRACT

An integrated circuit is provided that allows for the use of the same supply voltage pin to receive both a normal operating voltage for the integrated circuit (IC) and a one-time-programmable (OTP) memory program voltage sufficient to program an OTP memory located on the integrated circuit. In one embodiment, when an OTP programming voltage is received at a supply voltage pin of the IC, the OTP programming voltage is provided to the OTP memory of the integrated circuit and the OTP programming voltage is regulated to the normal operating voltage level prior to providing the voltage to the internal circuitry of the integrated circuit. As such, the present invention establishes a dual-purpose supply voltage pin, thereby eliminating the need for a separate OTP programming voltage pin on the integrated circuit.

20 Claims, 5 Drawing Sheets

(56) References Cited

U.S. PATENT DOCUMENTS

| | | |
|---|---|---|
| 7,750,618 B1 | 7/2010 | Fang et al. |
| 7,786,763 B1 | 8/2010 | Bal et al. |
| 7,816,959 B1 | 10/2010 | Isik et al. |
| 7,907,625 B1 | 3/2011 | MacAdam et al. |
| 7,941,723 B1 | 5/2011 | Lien et al. |
| 8,018,289 B1 | 9/2011 | Hu et al. |
| 8,164,367 B1 | 4/2012 | Bal et al. |
| 8,179,952 B2 | 5/2012 | Thurston et al. |
| 8,259,888 B2 | 9/2012 | Hua et al. |
| 8,284,816 B1 | 10/2012 | Clementi et al. |
| 8,305,154 B1 | 11/2012 | Kubena et al. |
| 8,537,952 B1 | 9/2013 | Arora et al. |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 2002/0079937 A1 | 6/2002 | Xanthopoulos et al. |
| 2002/0191727 A1 | 12/2002 | Staszewski et al. |
| 2003/0042985 A1 | 3/2003 | Shibahara et al. |
| 2004/0136440 A1 | 7/2004 | Miyata et al. |
| 2004/0165691 A1 | 8/2004 | Rana et al. |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla et al. |
| 2008/0246546 A1 | 10/2008 | Ha et al. |
| 2009/0140896 A1 | 6/2009 | Adduci et al. |
| 2009/0231901 A1* | 9/2009 | Kim ............... G11C 29/12 365/96 |
| 2009/0256601 A1 | 10/2009 | Zhang et al. |
| 2009/0262567 A1* | 10/2009 | Shin ............... G11C 5/147 365/96 |
| 2010/0052798 A1 | 3/2010 | Hirai et al. |
| 2010/0090731 A1 | 4/2010 | Casagrande et al. |
| 2010/0194483 A1 | 8/2010 | Storaska et al. |
| 2010/0323643 A1 | 12/2010 | Ridgers et al. |
| 2011/0006936 A1 | 1/2011 | Lin et al. |
| 2011/0285575 A1 | 11/2011 | Landez et al. |
| 2012/0161829 A1 | 6/2012 | Fernald et al. |
| 2012/0317365 A1 | 12/2012 | Elhamias et al. |
| 2012/0328052 A1 | 12/2012 | Etemadi et al. |
| 2013/0211758 A1 | 8/2013 | Prathapan et al. |
| 2014/0029646 A1 | 1/2014 | Foxcroft et al. |
| 2014/0210532 A1 | 7/2014 | Jenkins et al. |
| 2014/0327478 A1 | 11/2014 | Horng et al. |
| 2014/0347941 A1 | 11/2014 | Jose et al. |
| 2015/0162921 A1 | 6/2015 | Chen et al. |
| 2015/0180594 A1 | 6/2015 | Chakraborty et al. |
| 2015/0200649 A1 | 7/2015 | Trager et al. |

OTHER PUBLICATIONS

"NB3W1200L: 3.3 V 100/133 MHz Differential 1:12 Push-Pull Clock ZDB/Fanout Buffer for PCIe", ON Semiconductor, hittp://onsemi.com, Aug., 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase- Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansur!, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Niagaraju, "A Low Noise 1.5GHz VCO with a 3.75% Tuning Range Using Coupled FBAR's", IEEE International Ultrasonics Symposium (IUS), Oct. 2012, pp. 1-4.

Atanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

* cited by examiner

SYSTEM AND METHOD FOR VOLTAGE REGULATION OF ONE-TIME-PROGRAMMABLE (OTP) MEMORY PROGRAMMING VOLTAGE

FIELD OF THE INVENTION

This invention relates to integrated circuits comprising programmable memory modules and in particular to the programming of one-time-programmable (OTP) memory modules.

BACKGROUND OF THE INVENTION

One-time-programmable (OTP) memories are often implemented in integrated circuits and used to store program code and other information. Among other benefits, OTP memories prevent authorized program code from being modified or overwritten with unauthorized program code. Additionally, OTP memories may be programmed by an end user of the integrated circuit through the application of an externally generated programming voltage to the OTP memory. OTP memories are commonly formed of anti-fuse or floating gate non-volatile memory technologies. In order to program the memory cells of the OTP memory, a programming voltage having a voltage level that is higher than the normal operating voltage of the integrated circuit must be applied to the OTP memory cells.

The voltage level required to program an on-chip OTP memory is higher than the operating voltage of the other internal circuitry of the integrated circuit. Exposing the internal circuitry to the higher OTP programming voltage that is required to program the on-chip OTP memory would result in damage to the integrated circuit. As such, it is known in the art to include substantial additional internal circuitry within the integrated circuit that is responsible for the programming of the OTP memory. However, this additional internal circuitry requires the use of more area within the integrated circuit, which is undesirable. Alternatively, an additional programming pin may be provided on the integrated circuit that can be used to provide the higher programming voltage level to the OTP memory during programming. However, such an implementation requires that an extra programming pin be implemented on the integrated circuit. This implementation is undesirable because it increases the cost of the device and limits the backward pin-out compatibility of the integrated circuit.

Accordingly, what is needed in the art is an improved system and method for programming an on-chip OTP memory that does not require substantial additional internal circuitry or additional pins on the integrated circuit.

SUMMARY

In various embodiments, the invention includes an integrated circuit that allows for the use of the same supply voltage pin of the integrated circuit to receive both a normal operating voltage for the integrated circuit and a one-time-programmable (OTP) memory programming voltage sufficient to program an OTP memory located on the integrated circuit. As such, the present invention reduces the pin count of the integrated circuit by establishing a dual-purpose supply voltage pin, thereby eliminating the need for a separate OTP programming voltage pin on the integrated circuit.

In one embodiment, the invention includes a method of providing a programming voltage to a one-time-programmable (OTP) memory of an integrated circuit. The method includes, receiving an external voltage, having an external voltage level, at a supply voltage pin of an integrated circuit, the external voltage level equal to a normal operating voltage level for the integrated circuit or to an OTP programming voltage level for an OTP memory of the integrated circuit. The method further includes, if the external voltage level received at the supply voltage pin is the normal operating voltage level for the integrated circuit, providing the external voltage to the OTP memory of the integrated circuit and to internal circuitry of the integrated circuit and if the external voltage level received at the supply voltage pin is an OTP programming voltage level, providing the external voltage to the OTP memory of the integrated circuit and regulating the external voltage level to the normal operating voltage level of the integrated circuit to establish an internal operating voltage and providing the internal operating voltage to the internal circuitry of the integrated circuit.

In an additional embodiment, the invention includes an integrated circuit (IC) including a one-time-programmable (OTP) memory and an OTP programming voltage clamping regulator coupled to the OTP memory and to a supply voltage pin of an integrated circuit, the supply voltage pin for receiving an external voltage having an external voltage level, wherein the external voltage level is equal to a normal operating voltage level for the integrated circuit or to an OTP programming voltage level for the OTP memory of the integrated circuit. In this embodiment, if the external voltage level received at the supply voltage pin is the normal operating voltage level for the integrated circuit, the OTP programming voltage clamping regulator is configured to provide the external voltage to the OTP memory of the integrated circuit and to internal circuitry of the integrated circuit. Alternatively, if the external voltage level received at the supply voltage pin is an OTP programming voltage level, the OTP programming voltage clamping regulator configured to provide the external voltage to the OTP memory of the integrated circuit and the OTP programming voltage clamping regulator is further configured to regulate the external voltage level to the normal operating voltage level of the integrated circuit to establish a normal operating voltage and to provide the normal operating voltage to the internal circuitry of the integrated circuit.

In accordance with the invention, a single pin of the integrated circuit can be used to provide a programming voltage to the OTP memory that is sufficient to program the OTP memory and to provide a safe operating voltage to the internal circuitry of the integrated circuit.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

The present invention provides an integrated circuit that allows for the use of the same supply voltage pin of the integrated circuit to receive both a normal operating voltage for the integrated circuit and a one-time-programmable (OTP) memory programming voltage sufficient to program an OTP memory located on the integrated circuit. As such, the present invention reduces the pin count of the integrated circuit by establishing a dual-purpose supply voltage pin, thereby eliminating the need for a separate OTP programming voltage pin on the integrated circuit.

Figure 1A:
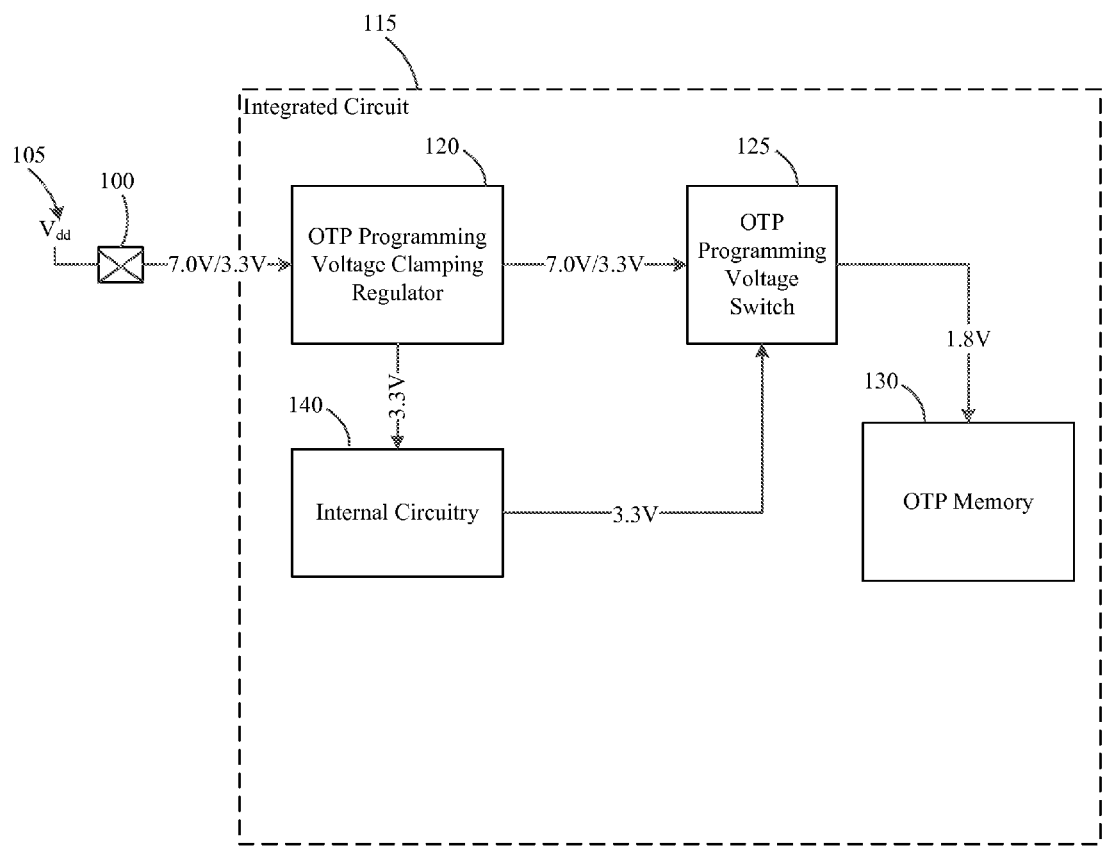
FIG. 1A is a diagrammatic view of an integrated circuit comprising an OTP programming voltage clamping regulator and associated supporting circuitry, in accordance with an embodiment of the present invention.
Figure 1B:
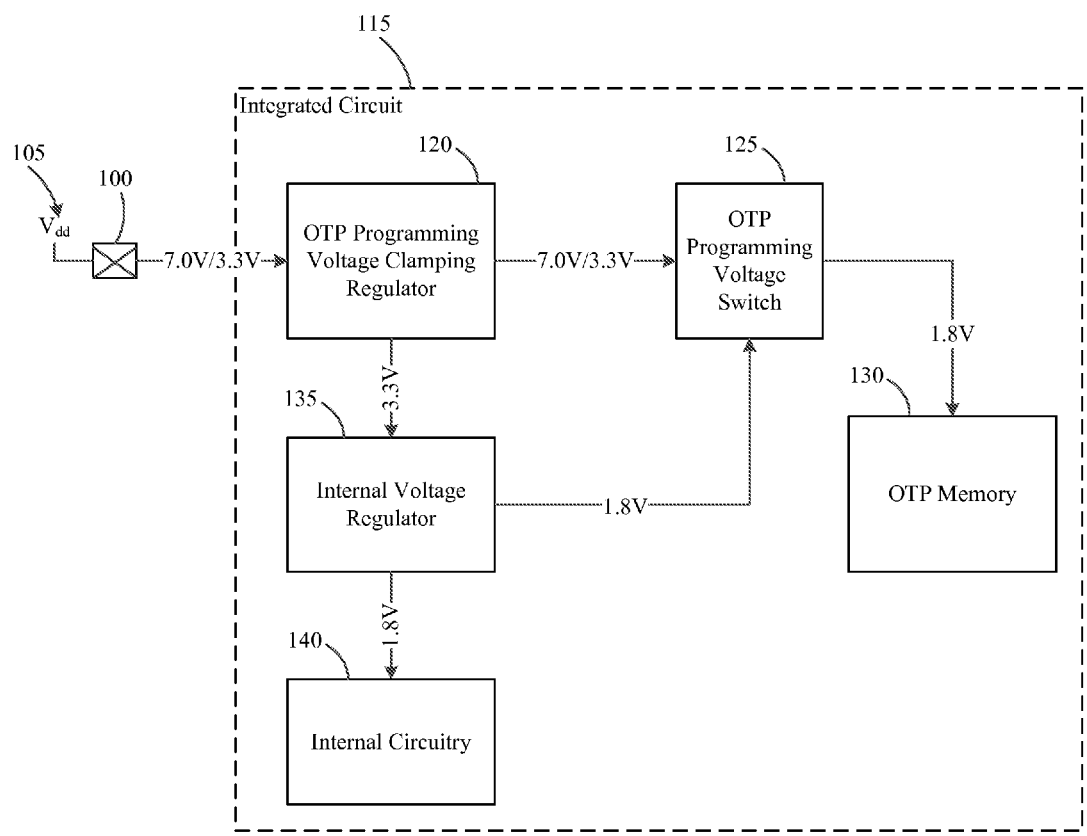
FIG. 1B is a diagrammatic view of an integrated circuit comprising an OTP programming voltage clamping regulator operating and an internal voltage regulator, along with including associated supporting circuitry, in accordance with an embodiment of the present invention

With reference to FIG. 1A and FIG. 1B, an integrated circuit (IC) 115 includes a supply voltage pin 100 for receiving an external voltage 105. The integrated circuit 115 further includes an OTP memory 130, an OTP programming voltage clamping regulator 120, an OTP programming voltage switch 125, an internal voltage regulator 135 and internal circuitry 140.

The one-time-programmable (OTP) memory 130 is a type of non-volatile memory (NVM) that utilizes standard complimentary metal-oxide-semiconductor (CMOS) components that are compatible with the other CMOS circuitry of the integrated circuit 115. The OTP memory 130 may comprise a plurality of memory cells, including p-type and n-type transistors configured to form a plurality of anti-fuses that can be programmed by the application of an OTP programming voltage to the OTP memory 130. During programming of the OTP memory 130, an OTP programming voltage is applied to particular transistors of the OTP memory 130, which causes the gate oxide of those transistors to break down, thus blowing the anti-fuse and programming the memory cell. In order to program the OTP memory 130, the voltage level of the OTP programming voltage provided to the OTP memory 130 during programming must be higher than the normal operating voltage of the integrated circuit 115. In one embodiment, the integrated circuit 115 may be a low-voltage CMOS integrated circuit 115, and the normal operating voltage level may be 3.3V and the OTP programming voltage may be 7.0V.

In operation of the integrated circuit 115, the supply voltage pin 100 is coupled to an external voltage 105 having an external voltage level. When the integrated circuit 115 is not actively programming the OTP memory 130, the external voltage 105 that is coupled to the supply voltage pin has an external voltage level that is equal to the normal operating voltage, $V_{dd}$, of the integrated circuit.

In the embodiment illustrated in FIG. 1A, the external voltage 105 coupled to the supply voltage pin 100 of the integrated circuit 115 may be 7.0V when the integrated circuit 115 is actively programming of the OTP memory 130 or 3.3V during normal operation of the integrated circuit 115. The supply voltage pin is coupled to the OTP programming voltage clamping regulator 120 of the integrated circuit 115. When the voltage level of the external voltage 105 is equal to the 3.3V normal operating voltage of the integrated circuit 115, the OTP programming voltage clamping regulator 120 acts as a pass-through and passes the external voltage 105 to the internal circuitry 140 of the integrated circuit and to the OTP memory 130 to provide a normal operating voltage of 3.3V for these elements.

In the embodiment shown in FIG. 1B, if the internal circuitry 140 is rated for operation at a voltage level that is lower than the normal operating voltage of 3.3V provided at the supply voltage pin 100, the external voltage 105 may first be provided to an internal voltage regulator 135 prior to being provided to the internal circuitry 140 and the OTP memory 130. The internal voltage regulator 135 may regulate the external voltage to a lower, internal operating voltage of the integrated circuit. In a particular embodiment, the internal voltage regulator 135 may reduce the voltage level of the external voltage from 3.3V to an internal voltage level of 1.8V. This internal voltage having a voltage level of 1.8V may then be provided to the internal circuitry 140 and the OTP memory 130. If the integrated circuit 115 is actively programming the OTP memory 130 and the external voltage 105 is therefore set to 7.0V, the external voltage 105 may first be clamped to 3.3V by the OTP programming voltage clamping regulator 120 prior to being further reduced by the internal voltage regulator 135 to an internal operating voltage of 1.8V In another embodiment, the integrated circuit 115 may include an OTP programming voltage switch 125 coupled to the OTP programming voltage clamping regulator 120, the internal voltage regulator 135 and the OTP memory 130. The OTP programming voltage switch 125 is configured to switch the voltage provided to the OTP memory 130 between the output voltage of the OTP programming voltage clamping regulator 120 and the output voltage of the internal voltage regulator 135. As such, in a particular embodiment when the OTP memory 130 is not being actively programmed, the OTP programming voltage switch 125 may provide either a 3.3V voltage level to the OTP memory 130 or a 1.8V voltage level to the OTP memory 130, dependent upon the specific configuration of the OTP memory 130.

Figure 2:
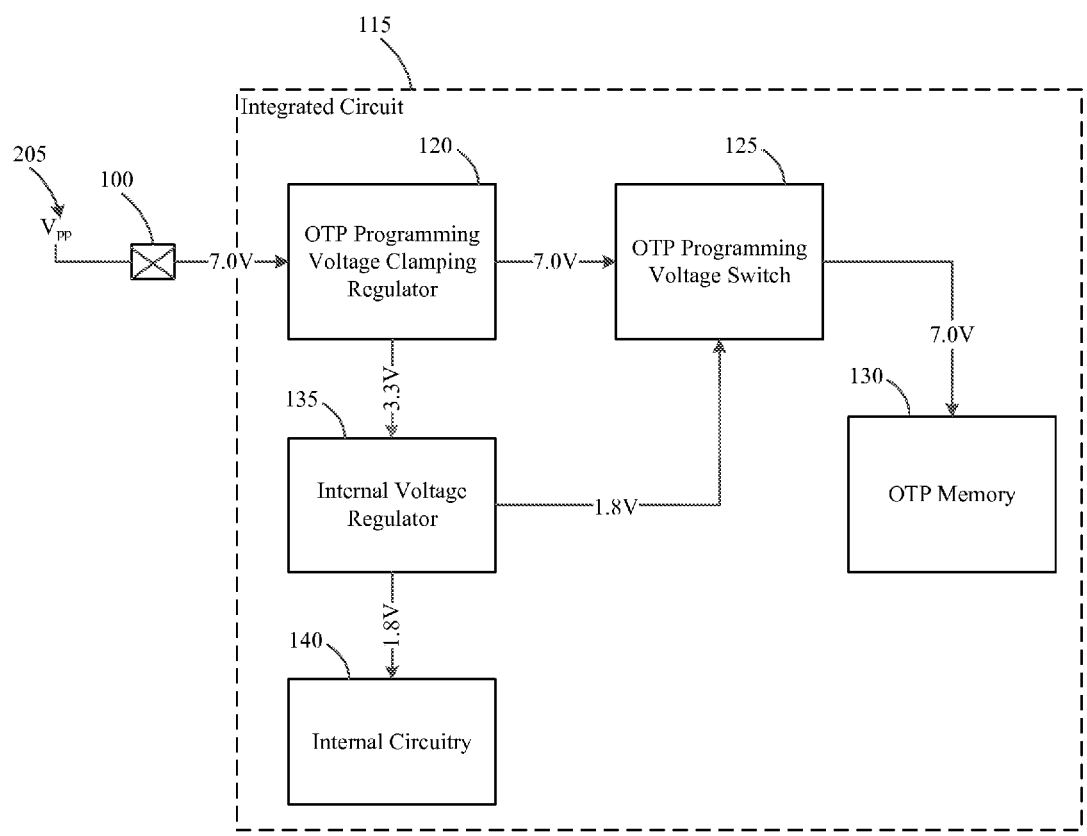
FIG. 2 is a diagrammatic view of an integrated circuit comprising an OTP programming voltage clamping regulator operating with an OTP programming voltage level and associated supporting circuitry, in accordance with an embodiment of the present invention.

With reference to FIG. 2, when the integrated circuit 115 is actively programming the OTP memory 130, the external voltage 205 that is coupled to the supply voltage pin 100 has an external voltage level that is equal to the OTP programming voltage level, $V_{pp}$, of the OTP memory 130. In the embodiment illustrated in FIG. 2, the external voltage 205 coupled to the supply voltage pin 100 of the integrated circuit 115 is 7.0V. The supply voltage pin 100 is coupled to the OTP programming voltage clamping regulator 120 of the integrated circuit 115. When the voltage level of the external voltage 205 is equal to the OTP programming voltage of the OTP memory 130, the OTP programming voltage clamping regulator 120 provides the external voltage 205 having OTP programming voltage level of 7.0V to the OTP memory 130 and the OTP programming voltage clamping regulator 120 regulates the external voltage level 205 to the normal operating voltage of the integrated circuit 115 prior to providing the external voltage to the internal circuitry 140. In a particular embodiment, when the voltage at the supply voltage pin 100 is at an OTP programming voltage level of 7.0V, the OTP programming voltage clamping regulator 120 provides the 7.0V OTP programming voltage to the OTP memory 130 and the OTP programming voltage is used to program the memory cells of the OTP memory 130, as previously described. In addition to providing the 7.0V OTP programming voltage to the OTP memory 130, the OTP programming voltage clamping regulator 120 regulates the 7.0V OTP programming voltage level received at the supply voltage pin 100 to establish a normal operating voltage of 3.3V that may then be provided to the other internal circuitry 140 of the integrated circuit 115.

In an additional embodiment, if the internal circuitry 140 is rated for operation at a voltage level that is lower than the normal operating voltage of 3.3V provided from the OTP programming voltage clamping regulator 120, the normal operating voltage may be provided to an internal voltage regulator 135 prior to being provided to the internal circuitry 140 and to the OTP memory 130. The internal voltage regulator 135 may regulate the normal operating voltage to a lower, internal operating voltage of the integrated circuit. In a particular embodiment, the internal voltage regulator 135 may reduce the voltage level of the normal operating voltage provided by the OTP programming voltage clamping regulator 120 from 3.3V to an internal voltage level of 1.8V. This internal voltage having a voltage level of 1.8V may then be provided to the internal circuitry 140 and the OTP memory 130 during normal operation of the OTP memory 130.

In another embodiment, the integrated circuit 115 may include an OTP programming voltage switch 125 coupled to the OTP programming voltage clamping regulator 120, the internal voltage regulator 135 and the OTP memory 130. The OTP programming voltage switch 125 is configured to switch the voltage provided to the OTP memory 130 between the output voltage of the OTP programming voltage clamping regulator 120 and the output voltage of the internal voltage regulator 135. As such, in a particular embodiment when the OTP memory 130 is being actively programmed, the OTP programming voltage switch 125 may provide a 7.0V programming voltage level to the OTP memory 130 during OTP programming, alternatively, the OTP programming voltage switch 125 may provide a 1.8V voltage level to the OTP memory 130 during normal operation of the OTP memory 130, dependent upon the specific configuration of the OTP memory 130.

Figure 3:
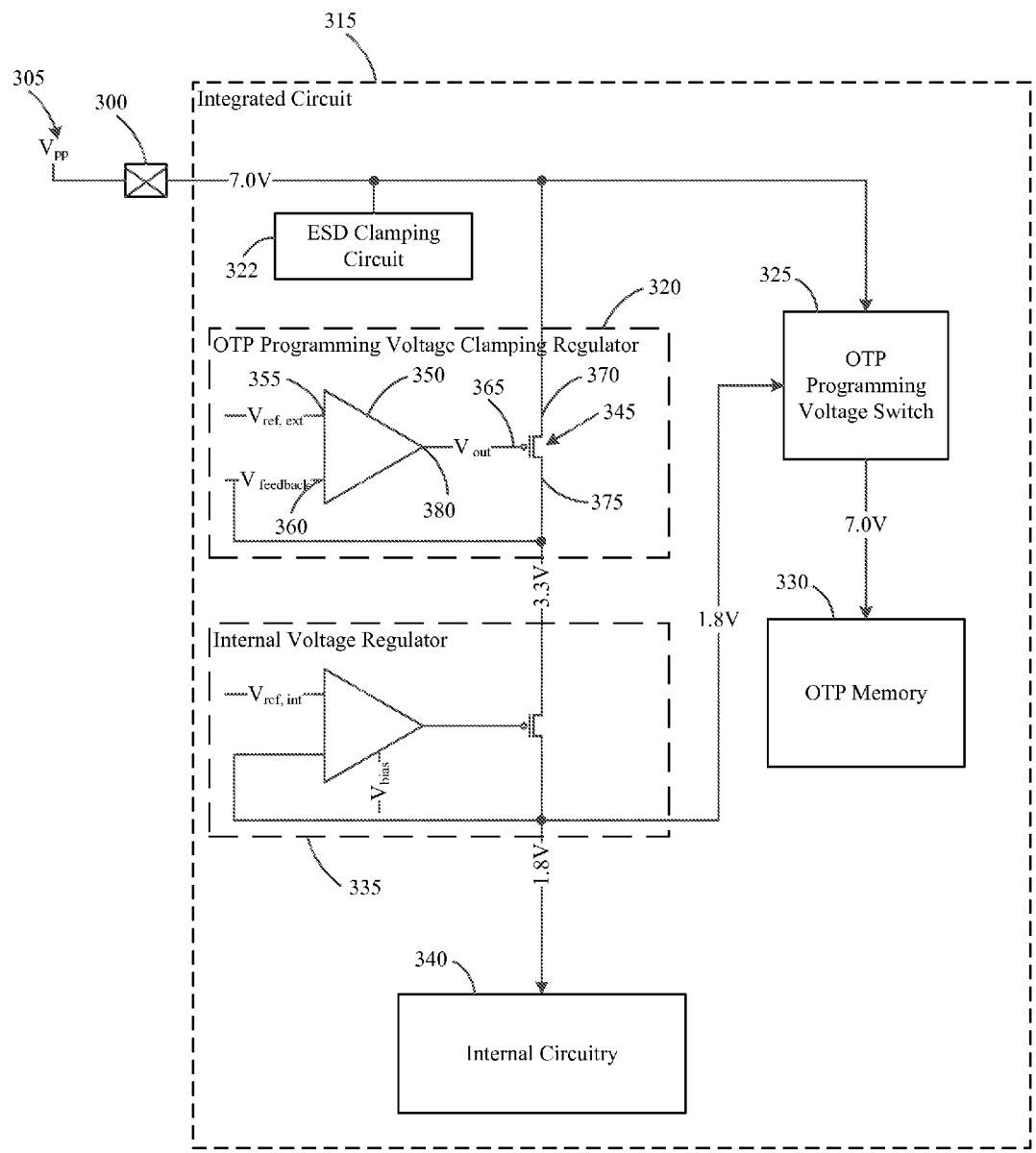
FIG. 3 is a diagrammatic view of an integrated circuit comprising an OTP programming voltage clamping regulator comprising a clamping transistor and configured to receive an OTP programming voltage and associated supporting circuitry, in accordance with an embodiment of the present invention.

The OTP programming voltage level required to program the OTP memory 130 of the integrated circuit 115 is higher than the voltage level that internal circuitry of the integrated circuit is designed to withstand. With reference to FIG. 3, in order to provide a single supply voltage pin 300 of the integrated circuit 315 that is capable of both programming the OTP memory 330 of the integrated circuit 315 and providing a normal operating voltage to the internal circuitry 340, a voltage clamp is required that will avoid damage to the internal circuitry 340 by preventing a voltage provided to the internal circuitry 340 from exceeding the normal operating voltage of the integrated circuit 315.

In the present invention, an OTP programming voltage clamping regulator 320 is provided for receiving an OTP programming voltage 305 at a supply voltage pin 300 that exceeds the normal operating voltage level of the internal circuitry 340 and to establish a normal operating voltage for the internal circuitry 340 that does not exceed the normal operating voltage level of the internal circuitry 340 while also providing the OTP programming voltage to the OTP memory 330.

In one embodiment, the OTP programming voltage clamping regulator 320 includes a voltage clamping transistor 345 coupled to the supply voltage pin 300, the voltage clamping transistor 345 configured to clamp the OTP programming voltage level 305 to the normal operating voltage level of the integrated circuit 315. The OPT programming voltage clamping regulator 320 may further include an operational amplifier 350, wherein the voltage clamping transistor 345 has a source node 370 coupled to the supply voltage pin 300 and the operational amplifier 350 has an output node 380 coupled to a gate node 365 of the voltage clamping transistor 345, a positive terminal 355 coupled to a reference voltage and a negative terminal 360 coupled to a drain node 375 of voltage clamping transistor 345. In one embodiment, the reference voltage provided to the positive terminal 355 of the operational amplifier 350 may be a band-gap reference voltage that is equal to the normal operating voltage of the integrated circuit 315. In this configuration, the operational amplifier 350 of the OTP programming voltage clamping regulator 320 is operating in a negative-feedback mode to stabilize the output voltage at the drain 375 of voltage clamping transistor 345 and hold the voltage at the normal operating voltage level.

In a particular embodiment, with an OTP programming voltage of 7.0V provided at the supply voltage pin 300, voltage clamping transistor 345 of the OTP programming voltage clamping regulator 320, clamps the 7.0V OTP programming voltage level to a normal operating voltage level of 3.3V and the operational amplifier 350 stabilizes the normal operating voltage level. The normal operating voltage level of 3.3V may then be provided to an internal voltage regulator 335 to establish a lower internal operating voltage level of 1.8V as previously described. In an additional embodiment, an OTP programming voltage switch 325 may be provided to switch the voltage level provided to the OTP memory 330 between the OTP programming voltage level of 7.0V and the internal operating voltage level of 1.8V.

The integrated circuit 315 may include an electrostatic discharge (ESD) clamping circuit 322 coupled to the supply voltage pin 300. ESD clamping circuits are commonly known in the art to reduce undesirable transient voltages on the supply voltage pin 300.

Figure 4:
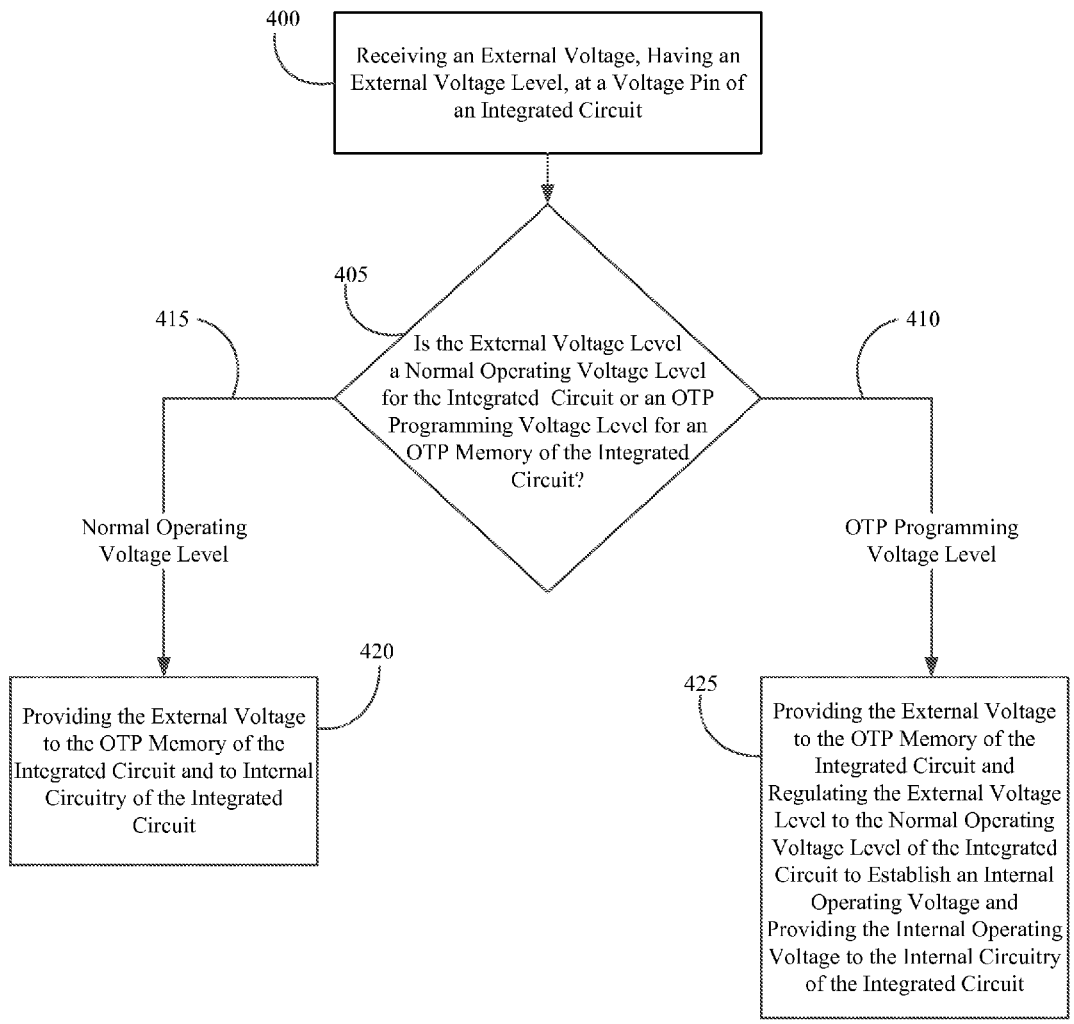
FIG. 4 is a flow diagram illustrating a method of using the same voltage pin of an integrated circuit to provide both a normal operating voltage and an OPT programming voltage to the integrated circuit, in accordance with an embodiment of the present invention.

With reference to FIG. 4, in operation of the present invention, a method of providing a programming voltage to a one-time-programmable (OTP) memory of an integrated circuit includes, receiving an external voltage, having an external voltage level, at a supply voltage pin of an integrated circuit 400. With reference to FIG. 1A, in one embodiment, the external voltage is received at a supply voltage pin 100 of an integrated circuit 115 comprising an OTP memory 130.

After the external voltage has been received, it is then determined if the external voltage level is equal to a normal operating voltage level for the integrated circuit or to an OTP programming voltage level for the OTP memory of the integrated circuit 405. With reference to FIG. 1A-1B, in a particular embodiment, the normal operating voltage 105 may be 3.3V and with reference to FIG. 2, the OTP programming voltage 205 may be 7.0V.

If it is determined that the external voltage level received at the supply voltage pin is the normal operating voltage level for the integrated circuit 415, the method proceeds by providing the external voltage to the OTP memory of the integrated circuit and to internal circuitry of the integrated circuit 420. With reference to FIG. 1A, when the voltage level at the supply voltage pin 100 is equal to the normal operating voltage level of the integrated circuit 115 of 3.3V, a voltage of 3.3V is provided to the internal circuitry 140 and to the OTP memory 130 of the integrated circuit 115. Alternatively, the normal operating voltage level of 3.3V may be further reduced to an internal operating voltage of 1.8V by an internal voltage regulator 135, as shown in FIGS. 1B-3.

However, if it is determined that the external voltage level received at the supply voltage pine is an OTP programming voltage level 410, the method proceeds by providing the external voltage to the OTP memory of the integrated circuit and regulating the external voltage level to the normal operating voltage level of the integrated circuit to establish an internal operating voltage and providing the internal operating voltage to the internal circuitry of the integrated circuit 425. With reference to FIG. 2, when the voltage level at the supply voltage pin 100 is equal to the OTP programming voltage level of the integrated circuit 115 of 7.0V, the OTP programming voltage clamping regulator 120 provides the OTP programming voltage level of 7.0V to the OTP memory 130, through an OTP programming voltage switch 125, and the OTP programming voltage clamping regulator 120 regulates the OTP programming voltage level to a normal operating voltage of 3.3V prior to providing the voltage to the internal circuitry 140 of the integrated circuit 115. Alternatively, the normal operating voltage level of 3.3V may be further reduced to an internal operating voltage of 1.8V by an internal voltage regulator 135, as previously described.

Accordingly, the present invention provides an improved system and method for programming an on-chip OTP memory that does not require substantial additional internal circuitry or additional pins on the integrated circuit. In accordance with the invention, a single pin of the integrated circuit can be used to provide a programming voltage to the OTP memory that is sufficient to program the OTP memory and to provide a safe operating voltage to the internal circuitry of the integrated circuit.

Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

Exemplary embodiment of the invention have been provided using an OTP memory comprising memory cells, however, the invention is not intended to be limited to a single OTP block of memory cells on an integrated circuit. It is within the scope of the present invention that the integrated circuit may comprise several separate blocks of OTP memory cells that may share circuitry, such as the OTP programming voltage clamping regulator and the OTP programming voltage switch, and/or other common circuitry. Alternatively, each block of OTP memory cells may have dedicated circuitry or may be arranged such that some blocks of OTP memory cells share some of the common circuitry while others do not share the common circuitry.

In one embodiment, the integrated circuit 115 comprising the OTP memory 130 and the OTP voltage clamping regulator 120 may be a single semiconductor die. Alternatively, the integrated circuit may include multiple semiconductor die that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC) suitable for the design of encoders/decoders for LDPC codes. As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of providing a programming voltage to a one-time-programmable (OTP) memory of an integrated circuit, the method comprising:
    receiving an external voltage, having an external voltage level, at a supply voltage pin of an integrated circuit, the external voltage level equal to a normal operating voltage level for the integrated circuit or to an OTP programming voltage level for an OTP memory of the integrated circuit;
    if the external voltage level received at the supply voltage pin is the normal operating voltage level for the integrated circuit, providing the external voltage to the OTP memory of the integrated circuit and to internal circuitry of the integrated circuit; and
    if the external voltage level received at the supply voltage pin is an OTP programming voltage level, providing the external voltage to the OTP memory of the integrated circuit and regulating the external voltage level to the normal operating voltage level of the integrated circuit to establish a normal operating voltage and providing the normal operating voltage to the internal circuitry of the integrated circuit.

2. The method of claim 1, wherein regulating the external voltage level to the normal operating voltage level of the integrated circuit to establish a normal operating voltage and providing the normal operating voltage to the internal circuitry of the integrated circuit further comprises, providing the external voltage to an OTP programming voltage clamping regulator to regulate the OTP programming voltage level to the normal operating voltage level of the integrated circuit to establish the normal operating voltage.

3. The method of claim 2, wherein providing the external voltage to an OTP programming voltage clamping regulator to regulate the OTP programming voltage level to the normal operating voltage level of the integrated circuit to establish the normal operating voltage further comprises, clamping the external voltage to the normal operating voltage level using a voltage clamping transistor.

4. The method of claim 1, further comprising, regulating the normal operating voltage level of the integrated circuit to an internal operating voltage level of the integrated circuit to establish an internal operating voltage for the integrated circuit.

5. The method of claim 4, wherein regulating the normal operating voltage of the integrated circuit to an internal operating voltage level of the integrated circuit to establish an internal operating voltage of the integrated circuit further comprises, providing the normal operating voltage to an internal voltage regulator to regulate the normal operating voltage level of the internal operating voltage to the internal operating voltage level.

6. The method of claim 1, wherein the OTP programming voltage level of the OTP memory is 7V.

7. The method of claim 5, wherein the normal operating voltage level of the integrated circuit is 3.3V and the internal operating voltage level of the integrated circuit is 1.8V.

8. The method of claim 1, further comprising, if the external voltage level of the external voltage received at the supply voltage pin is the normal operating voltage level for the integrated circuit, providing the external voltage to an OTP programming voltage switch prior to providing the external voltage to the OTP memory of the integrated circuit.

9. The method of claim 1, further comprising, if the external voltage level of the external voltage received at the supply voltage pin is an OTP programming voltage level, providing the external voltage to an OTP programming voltage switch prior to providing the external voltage to the OTP memory of the integrated circuit.

10. An integrated circuit (IC) comprising:
a one-time-programmable (OTP) memory;
an OTP programming voltage clamping regulator coupled to the OTP memory and to a supply voltage pin of an integrated circuit, the supply voltage pin for receiving an external voltage having an external voltage level, wherein the external voltage level is equal to a normal operating voltage level for the integrated circuit or to an OTP programming voltage level for the OTP memory of the integrated circuit; and
if the external voltage level received at the supply voltage pin is the normal operating voltage level for the integrated circuit, the OTP programming voltage clamping regulator configured to provide the external voltage to the OTP memory of the integrated circuit and to internal circuitry of the integrated circuit; and
if the external voltage level received at the supply voltage pin is the OTP programming voltage level, the OTP programming voltage clamping regulator configured to provide the external voltage to the OTP memory of the integrated circuit and the OTP programming voltage clamping regulator further configured to regulate the external voltage level to the normal operating voltage level of the integrated circuit to establish a normal operating voltage and to provide the normal operating voltage to the internal circuitry of the integrated circuit.

11. The integrated circuit of claim 10, wherein the OTP programming voltage clamping regulator comprises a voltage clamping transistor coupled to the supply voltage pin, the voltage clamping transistor configured to clamp the OTP programming voltage level to the normal operating voltage level of the integrated circuit.

12. The integrated circuit of claim 10, wherein the OTP programming voltage clamping regulator comprises:
a voltage clamping transistor having a source node coupled to the supply voltage pin; and
an operational amplifier having an output node coupled to a gate node of the voltage clamping transistor, a positive terminal coupled to a reference voltage and a negative terminal coupled to a drain node of the clamping transistor.

13. The integrated circuit of claim 10, further comprising, an internal voltage regulator coupled to the OTP programming voltage clamping regulator, the internal voltage regulator configured to regulate the normal operating voltage level of the integrated circuit to an internal operating voltage level of the integrated circuit to establish an internal operating voltage for the integrated circuit.

14. The integrated circuit of claim 10, wherein the OTP programming voltage level of the OTP memory is 7V.

15. The integrated circuit of claim 13, wherein the normal operating voltage level of the integrated circuit is 3.3V and the internal operating voltage level of the integrated circuit is 1.8V.

16. The integrated circuit of claim 10, further comprising, an OTP programming voltage switch coupled to the OTP memory and to the supply voltage pin, the OTP programming voltage switch configured to provide the external voltage to the OTP memory of the integrated circuit if the external voltage level of the external voltage received at the supply voltage pin is the normal operating voltage level for the integrated circuit, and the OTP programming voltage switch configured to provide the external voltage to the OTP memory of the integrated circuit if the external voltage level of the external voltage received at the supply voltage pin is an OTP programming voltage level.

17. The integrated circuit of claim 10, further comprising an ESD clamping circuit coupled to the supply voltage pin.

18. The integrated circuit of claim 10, wherein the OTP memory comprises at least one OTP memory cell.

19. The integrated circuit of claim 10, wherein the OTP programming voltage level is sufficient to program the OTP memory.

20. An integrated circuit (IC) comprising:
a one-time-programmable (OTP) memory;
an OTP programming voltage clamping regulator comprising a clamping transistor having a source node coupled to the supply voltage pin and an operational amplifier having an output node coupled to a gate node of the voltage clamping transistor, a positive terminal coupled to a reference voltage and a negative terminal coupled to a drain node of the clamping transistor, the supply voltage pin for receiving an external voltage having an external voltage level, wherein the external voltage level is equal to a normal operating voltage level for the integrated circuit or to an OTP programming voltage level for the OTP memory of the integrated circuit; and
if the external voltage level received at the supply voltage pin is the normal operating voltage level for the integrated circuit, the OTP programming voltage clamping regulator configured to provide the external voltage to the OTP memory of the integrated circuit and to internal circuitry of the integrated circuit; and
if the external voltage level received at the supply voltage pin is the OTP programming voltage level, the OTP programming voltage clamping regulator configured to provide the external voltage to the OTP memory of the integrated circuit and the OTP programming voltage clamping regulator further configured to regulate the external voltage level to the normal operating voltage level of the integrated circuit to establish a normal operating voltage and to provide the normal operating voltage to the internal circuitry of the integrated circuit.

* * * * *